Dec. 21, 1965

D. C. CRONEMEYER 3,225,272

SEMICONDUCTOR TRIODE

Filed Jan. 23, 1961

INVENTOR.
DONALD C. CRONEMEYER

BY Richard I. Seeger

ATTORNEY 3,225,272

SEMICONDUCTOR TRIODE

Donald C. Cronemeyer, Birmingham, Mich., assignor to The Bendix Corporation, Southfield, Mich., a corporation of Delaware Filed Jan. 23, 1961, Ser. No. 84,269
11 Claims. (Cl. 317—235)

This invention pertains to a semiconductor triode and, more particularly, to a triode having three heavily doped layers which are joined together to form an N-P junction, and a P-N junction through which carriers flow according to the "tunneling" concept.

This invention is an improvement over the tunnel or Esaki diode having a single junction and which uses heavily doped N and P layers resulting in conduction due to electrons in the conduction band or of one layer moving directly across a narrow junction to the valence band of the other layer. This differs from the carrier injection conduction which occurs in more lightly doped semi-conductor devices and which also occurs in the tunnel diode at high forward bias voltages. In the tunnel or Esaki diode there is no control over the current through the diode, and there are only two terminals which makes it difficult to use the diode for certain purposes such as for multiple amplifier stages.

This invention provides an improvement over the tunnel diode by a construction of two junctions between heavily doped semiconductor materials with the spacing between the junctions being very small so that the tunnel current from the emitter can proceed through the base region between the two junctions and across the collector junction.

It is, therefore, an object of this invention to provide a semiconductor triode having three semiconductor areas of large impurity concentration with two of the areas, the emitter and collector areas, being of one impurity type and joined to and separated by the third area or base area, which is of the opposite impurity type. The portion of the base area which is between the emitter and collector areas is small enough so that carriers may tunnel from the emitter, through the base, to the collector area.

It is an object of this invention to form such a triode by having a wafer as the base material and have two contacts spaced closely together alloyed to the base material with a heavily doped alloy material yielding opposite type impurity regions on either side of the base material.

It is a further object of this invention to alternatively form such a triode with a layer of base material which has a dimple formed on one surface thereof and two contacts spaced closely together alloyed to the central region of the dimple with materials which are heavily doped with an impurity opposite to the base impurity.

Another object of this invention is to provide a semiconductor of the first object with a wafer of base material having aligned dimples in opposite surfaces, there being a contact alloyed to the center of each dimple with the material having a high concentration of an impurity opposite to that of the base impurity.

Another object of this invention is to provide a triode of the first object having a wedge shaped base with contacts being alloyed on opposite sides of the edge of the wedge with an alloying material which has a heavy concentration of an impurity opposite to that of the base impurity.

These and other objects will become more apparent when preferred embodiments of my invention are described in connection with the drawings in which.

Figures 1, 2, 3, 4, 5, 6, 7:
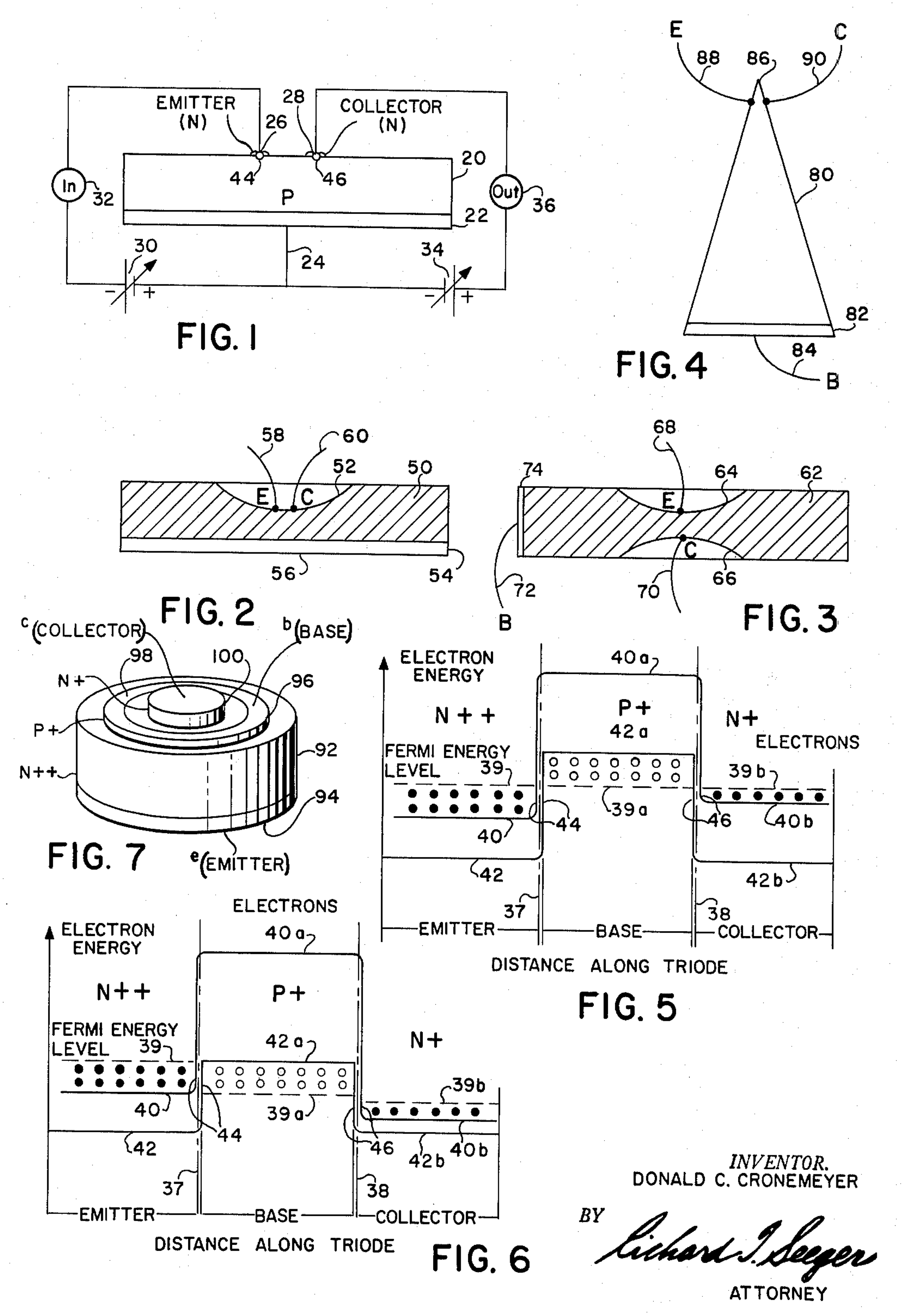
FIGURE 1 is an elevational, schematic view of a first preferred embodiment.
FIGURE 2 is a sectioned, schematic view of a second preferred embodiment.
FIGURE 3 is a sectioned, schematic view of a third preferred embodiment.
FIGURE 4 is a schematic, elevational view of a fourth preferred embodiment.
FIGURE 5 is an energy-distance curve in the unbiased condition which may be applicable to the preferred embodiments in FIGURES 1–4.
FIGURE 6 is similar to FIGURE 5, but shows the triode in a biased condition.
FIGURE 7 is a view in perspective of a further embodiment of this invention.

In FIGURE 1 is shown a base 20 of a triode with one side of the base 20 having a conductive coating 22 and a base lead 24 attached to coating 22. Base 20, in this embodiment, is heavily doped with a P type of impurity, of a kind well known to the art, to a density of about $10^{19}$ molecules per cubic centimeter or more. An emitter lead 26 is alloyed to base 20 with a very heavily N type doped material, and a collector lead 28 is alloyed to base 20 with a very heavily N type doped material and at a point which is very close to emitter lead 26. The distance between the emitter lead 26 and collector lead 28 at their points of connection to base 20 would be about 100 angstrom units when the semiconductor material used is silicon, germanium or gallium arsenide and at about room temperature. For preferred results, this dimension should be varied inversely with ambient temperature and impurity content with the lower temperature resulting in wider spacing and the higher impurity content resulting in smaller spacing. The doping of the emitter contact is preferably heavier than the doping of either the base material or the collector material. A variable bias 30 is in the emitter base circuit along with input 32. A variable bias 34 is in the base collector circuit along with output 36.

FIGURES 5 and 6 will be referred to in order to facilitate the understanding of operation for the embodiment of FIGURE 1. In FIGURES 5 and 6 the ordinate of the graph represents electron energy in the triode and the abscissa of the graph represents the longitudinal dimension of the triode. Line 37 passes through the N-P junction formed by the alloying between emitter lead 26 and base 20 and line 38 passes through the P-N junction formed by the alloying of collector lead 28 to base 20. In this embodiment the distance between line 37 and 38, in the case of silicon alloying material at a temperature of about 30° C. and an impurity concentration of $10^{19}$ atoms per cubic centimeter, is about 100 angstrom units.

Dashed lines 39, **39*a*, and 39*b* represent the Fermi energy level; lines 40, 40*a* and 40*b* represent, respectively, the conduction level lines of the emitter, base and collector sections in the triode; and lines 42, 42*a* and 42*b* represent, respectively, the valence level lines of the emitter, base and collector sections in the triode. The areas between the conduction levels 40, 40*a* and 40*b* and the valence levels 42, 42*a* and 42*b* are the "forbidden" regions of the energy diagram in which electrons are reluctant to exist. The emitter-base junction 44, which is formed between the nearly vertical lines connecting conduction levels 40 and 40*a* and valence levels 42 and 42*a*, is maintained at a very narrow width which in the preferred embodiment is of the order of 10 angstrom units. Similarly, the base-collector junction 46, the width of which is defined by the lines connecting conduction levels 40*a* and 40*b* and valence levels 42*a* and 42*b*** is formed with a narrow width.

The electrons are present in the areas which are: (1) between the Fermi level line 39 and conduction band line 40 in the emitter region of the diagram; (2) below the Fermi level line **39*a* in the valence band region of the base; and (3) between the Fermi level line 39*b* and the conduction level line 40*b*** in the collector. Holes exist between the valence level 42*a* and Fermi level line 39*a* in the base. By raising the Fermi level line 39 in the emitter region relative to the Fermi level line 39*a* in the base region, and by lowering the Fermi level line 39*b* with respect to 39*a*, the Fermi level in the base region, as shown in FIGURE 6, electrons can go directly through junctions 44, 46, in a "tunneling" action. The Fermi energy line 39 in the emitter region can be raised with respect to line 39*a* in the base region by increasing bias 30, and line 39*b* in the collector region can be lowered relative to the line in the base region by increasing bias 34. "Tunneling" results in much faster carrier action, and this invention provides a three terminal device which has accurate gain control through adjustment of biases 30 and 34. It should also be possible to operate this embodiment with zero bias between the base and collector.

A second embodiment is shown in FIGURE 2 wherein a base material 50 has a dimple 52 formed therein with a conductive coating 54 on the surface opposite the dimpled surface and a base lead 56 attached to coating 54. Emitter lead 58 is alloyed to the central area of dimple 52 with a heavily doped N type material; and collector lead 60 is also alloyed to the central area of dimple 52 with a heavily doped N type material and at a point closely spaced relative to the alloyed emitter lead 58. The advantage of this embodiment is its low base resistance from lead 56 to the junctions formed by the emitter and collector leads 58 and 60.

In FIGURE 3 is shown a third embodiment having a base material 62 which is heavily doped with P type material and has a dimple 64 formed on one surface and a dimple 66 formed on the opposite surface and aligned with dimple 64 so that the dimple centers define a very narrow width of base 62 material. An emitter lead 68 is alloyed to the center portion of dimple 64 with a heavily doped N type material to form an N-P junction and a collector lead 60 is alloyed to the center of dimple 66 with a heavily doped N type material to form a P-N junction. A base lead 72 is connected to a conductive coating 74 which is an end surface of base 62. The advantage of this embodiment is that a very narrow area of base material is formed between dimples 64 and 66 with a relatively large and strong supporting structure.

A fourth embodiment is shown in FIGURE 4 wherein the base material 80 which is of heavily doped P type material is wedge shaped and has at the base thereof a conductive coating 82 to which is attached a base lead 84. At the edge 86 of wedge 80, an emitter lead 88 is alloyed to one side of wedge 80 with a heavily doped N type material to form an N-P junction and a collector lead 90 is connected to an opposite side of wedge 80 by alloying with a heavily doped N type material to form a P-N junction. The advantage of this embodiment is that the emitter-collector leads can be very closely spaced to one another and attached to relatively large surfaces while still providing a relatively strong semiconductor structure.

A further embodiment of this invention is shown in FIGURE 7. The embodiment in this figure is formed by a vapor deposition process such as the iodide disproportionation process, or the halide pyrolysis process. A highly doped N type seed wafer 92 is provided on its lower surface with a conductive plating 94 to which a terminal may be connected, and the upper surface of the wafer 92 is masked so that an outer ring is covered. Then a very thin base layer of P-type doping 96 is vapor deposited on the masked upper surface of emitter layer 92, with the thickness of layer 96 preferably being in a range such as 10 to 100 angstrom units. A conductive plating 98 to which a base lead may be attached is formed on the outer ring portion of layer 96. Layer 96 is masked and a relatively thick (in the preferred embodiment of the order of several mils) collector layer 100 of N-type doping is vapor deposited on the center portion of layer 96. The upper surface of layer 100 may also be plated for electrical connection. Leads *e*, *b*, and *c* may be attached as by soldering to the respective plated areas on the emitter, base and collector.

Embodiments shown in FIGURES 2–4 and 7 operate in a manner similar to the embodiment shown in FIGURE 1.

Although this invention has been disclosed and illustrated with reference to particular applications, the principles involved are susceptible of numerous other applications which will be apparent to persons skilled in the art. The invention is, therefore, to be limited only as indicated by the scope of the appended claims.

Having thus described my invention, I claim:

1. A semiconductor triode comprising an emitter section, base section, and collector section, at least a portion of said base section being between said emitter section and collector section, the width of base section material between said emitter section and collector section being less 300 angstrom units, said base section being of a material having one of an N and P doping and said emitter section and collector section being of materials having the other of the N and P doping, the doping of all the materials being sufficiently high to provide for movement of the carriers from one material to an adjacent material through the potential barrier between the sections, between a valence band in one material and a conduction band in the other material.

2. A semiconductor triode comprising an emitter, base, and collector, junctions being formed between said emitter and base and base and collector, the doping of all of the materials of the emitter, base, and collector being sufficiently high to provide for movement of the carriers between a valence band on one side of each junction and a conduction band on the other side of each junction, the distance between said junctions being sufficiently small so that carriers can enter from said emitter and travel to said collector before they become joined with carriers of the opposite sign in the base.

3. The apparatus of claim 2 with said emitter material being more heavily doped than either of said base and collector materials.

4. The apparatus of claim 2 having means for providing a voltage difference between said emitter and said base so that electrons in the conduction band of one assume substantially the same energy level as the holes in the valence band of the other to assist tunneling in the base.

5. The apparatus of claim 2 wherein said base comprises a wafer of heavily doped semiconductor material, said emitter and collector being alloyed with opposite type doping to one wafer surface and the base electrode being connected to a second wafer surface.

6. The apparatus of claim 5 with said one wafer surface being dimpled at that portion where said emitter and collector electrodes are alloyed.

7. The apparatus of claim 2 wherein said base comprises a heavily doped wafer having dimples in opposite surfaces and aligned with one another, said emitter being alloyed with opposite doping to one dimple center and said collector being alloyed with opposite doping to the opposite dimple center.

8. The apparatus of claim 2 wherein said base comprises a heavily doped wedge, said emitter being alloyed with opposite doping to one side of said wedge adjacent the wedge edge and said collector being alloyed with opposite doping to the other side of said wedge adjacent the wedge edge.

9. The triode of claim 2 with said base being vapor deposited on one of said emitter and collector, the other of said emitter and collector being vapor deposited on a first portion of said base, a conductor lead attaching plating being on a second portion of said base.

10. The triode of claim 9 wherein said first portion is the center of said base and said second portion is a ring along the outer circumference of said base, and a ring of non-plated base material being between said first and second portions.

11. The triode of claim 2 wherein said base is 10–100 angstrom units thick between said emitter and collector.

References Cited by the Examiner

UNITED STATES PATENTS

| | | | |
|---|---|---|---|
| 2,695,852 | 11/1954 | Sparks. | |
| 2,697,269 | 12/1954 | Fuller | 29—25.3 |
| 2,757,323 | 7/1956 | Jordan et al. | 317—239 |
| 2,792,538 | 5/1957 | Pfann | 317—235 |
| 2,795,743 | 6/1957 | Lehovec | 317—235 |
| 2,870,052 | 1/1959 | Rittman | 317—235 |
| 2,871,377 | 1/1959 | Tyler et al. | 307—88.5 |
| 3,027,501 | 3/1962 | Pearson | 317—235 |
| 3,039,028 | 6/1962 | Ross | 317—235 |
| 3,053,998 | 9/1962 | Chynoweth | 317—234 |
| 3,079,512 | 2/1963 | Rutz | 317—234 |

FOREIGN PATENTS

| | | |
|---|---|---|
| 1,165,491 | 10/1958 | France. |

DAVID J. GALVIN, *Primary Examiner.*

SAMUEL BERNSTEIN, *Examiner.*